Figure 1:
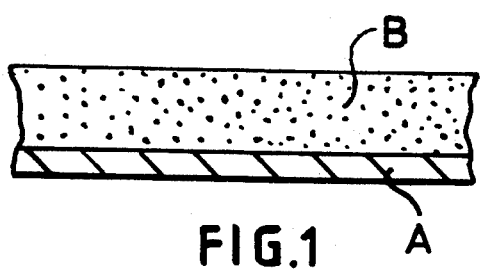

United States Patent [19]

Weinreich

[11] Patent Number: 5,435,671

[45] Date of Patent: Jul. 25, 1995

[54] DRILLING PRINTED CIRCUIT BOARDS AND ENTRY AND BACKING BOARDS THEREFOR

[75] Inventor: Rudolf W. Weinreich, London, England

[73] Assignee: Holders Technology PLC, England

[21] Appl. No.: 94,177

[22] PCT Filed: Feb. 3, 1992

[86] PCT No.: PCT/GB92/00199

§ 371 Date: Sep. 15, 1993

§ 102(e) Date: Sep. 15, 1993

[87] PCT Pub. No.: WO92/14346

PCT Pub. Date: Aug. 20, 1992

[30] Foreign Application Priority Data

Feb. 7, 1991 [GB] United Kingdom ............... 9102672
Sep. 19, 1991 [GB] United Kingdom ............... 9120016

[51] Int. Cl.[6] ..................... B23B 35/00; B23B 51/06
[52] U.S. Cl. .................................................. 408/1 R
[58] Field of Search ...................................... 408/1 R

[56] References Cited

U.S. PATENT DOCUMENTS

| | | | |
|---|---|---|---|
| 3,414,084 | 12/1968 | Bues et al. | 184/1 |
| 3,700,341 | 10/1972 | Block | 408/1 R |
| 4,311,419 | 1/1982 | Block | 408/1 R |
| 4,781,495 | 11/1988 | Hatch et al. | 408/1 R |

FOREIGN PATENT DOCUMENTS

| | | |
|---|---|---|
| 0238161 | 1/1987 | European Pat. Off. . |
| 0264816 | 4/1988 | European Pat. Off. . |
| 2527956 | 12/1983 | France . |
| 81/00367 | 2/1981 | WIPO . |

*Primary Examiner*—Steven C. Bishop
*Attorney, Agent, or Firm*—Davis, Bujold & Streck

[57] ABSTRACT

The invention provides an entry board for use adjacent a printed circuit board during drilling therethrough comprising a drill lubricant distributed over the entry board. The board may comprise two or more separable laminar components (A, B) one of which has the drill lubricant. There is also provided a composite entry or backing board for use adjacent a printed circuit board during drilling therethrough, in which the adjacent faces of two laminar components of the entry or backing board are joined such that there is no relative slip during transportation, cutting and positioning, and they are separable by peeling them apart after use.

16 Claims, 1 Drawing Sheet

DRILLING PRINTED CIRCUIT BOARDS AND ENTRY AND BACKING BOARDS THEREFOR

This invention relates to a method of drilling holes in printed circuit boards and to an entry or backing board adapted for use in such a method.

It is well known that in drilling printed circuit boards it is usual to use dummy boards on either side or both sides of the board or boards to be drilled. These dummy boards are sometimes referred to as backing and entry boards. A backing, or back-up, board is disclosed in U.S. Pat. No. 3,700,341, comprising a laminate of aluminum foil firmly bonded to Masonite, a fibrous board. A laminated entry board is disclosed in U.S. Pat. No. 4,311,419. When many boards are being drilled they are usually made up in stacks consisting of an entry board on top of the printed circuit board material. There are a number of reasons for this-one of these is to reduce burring, another to prevent damage to the top laminate in the stack and another to improve drilling accuracy. At the bottom of the stack there is usually another board called the back-up board which is there for a number of reasons, one of which being to prevent the drills drilling into the base tooling plate of the drilling machine, and another being to prevent burring of the printed circuit board material. Various materials are used for the dummy boards, but the most common dummy boards are composite boards consisting of a metal cladding on one or both sides of a softer, often organic, sheet of material. The metal is rigidly and permanently bonded to the substrate or substrate by means of a permanent adhesive such as an epoxy resin.

Large quantities of these cladded boards are in use and the difficulty of their disposal is a matter for concern. The metal component makes it difficult to dispose of the used boards and the strong adhesion of the metal makes it difficult to reclaim same economically. Strong adhesion has been considered to be important for the rigidity of the board and for its resistance to the torsion of the drill bit. There is thus an environmental problem as well as an economic problem through the failure to recycle the dummy boards.

The invention overcomes this problem by providing a composite entry or backing board for use adjacent a printed circuit board during drilling therethrough, in which the adjacent faces of two laminar components of the entry board are joined such that there is no relative slip during transportation, cutting and positioning, and such that they are separable by peeling them apart after use.

Preferably, the two laminar components are a substrate, which may be fibrous board or paper, and a metal or metal alloy foil or sheet; typical thickness ranges being respectively 0.1–4 mm and 0.02–1 mm. The substrate thickness is preferably at least 0.020 mm, preferably at least 0.20 mm, and in many cases at least 0.5 mm, and the foil or sheet is preferably at least 0.04 mm thick. The laminar components are preferably joined by an intermediate layer or a low-strength, preferably permanent tack, adhesive; alternatively, a similar result may be achieved using an intermediate double-sided adhesive tape. The adhesive materials in each case should preferably be coupled less strongly to the metal or metal alloy component, where one is used, than to the other laminar component, so that it may more readily be recycled.

Alternatively, the laminar components may be joined by keying together their opposed surfaces, by for example roughening or texturing one or both surfaces and pressing them together. Thus the laminar components are joined face to face without any intermediate adhesive.

The join between the laminar components need not extend over their whole area, but may take effect in strips or spots or other partial areas, provided there is sufficient regidity for the intended application.

Another problem associated with the drilling of printed circuit boards has been the effect of the board material on the drill bit. Circuit boards commonly contain much epoxy resin. During the drilling operation the resin becomes firmly bonded to the margins and flutes of the drills. This increases the power requirement, the heat input and causes smearing inside the drilled holes. In some cases the resin build up limits the useful life the drills. The resin can be difficult and expensive to remove when drills are being refurbished.

According to another aspect of the invention, therefore, an entry board for use adjacent a printed circuit board (PCB) during drilling therethrough comprises a PCB-engaging sheet adapted to resist burr-formation during drilling, characterised in that it is laminated with a non-metallic sheet over whose surface is distributed a drill lubricant. Where the entry board comprises a paper board, the lubricant can be incorporated into the paper. The lubricant may be any dry film lubricant such as graphite, molybdenum disulphide or polytetrafluoroethane (ptfe) and it may be interspersed in the material during manufacture or it may be applied subsequently by brushing, rollcoating or spraying, or by any other coating method such as the "air knife". The lubricant may alternatively be incorporated within the adhesive before application. The preferred lubricant is ptfe.

Preferably, the entry board comprises the said non-metallic sheet and a further sheet as two laminar components whose faces are joined such that there is no relative slip during transportation, cutting and positioning, and such that they are separable by peeling them apart. Thus the non-metallic sheet, for example constituting a substrate of a fibrous board, is provided with the drill lubricant, preferably on the surface which faces away from the further sheet which in preferred embodiments is aluminium.

The drill lubricant reduces or eliminates resin build-up on the drill bit and helps to prolong the useful drill life and reduce smearing in the drilled hole.

In another aspect, the invention provides a method of drilling a printed circuit board, comprising placing an entry or backing board in accordance with either aspect of the invention defined above next to the printed circuit board and drilling through both boards. In the case where the entry or backing board has two laminar components, the method advantageously includes the further step of peeling off one of the laminar components, i.e. the metal/metal alloy component when such is used, of the board for reclamation.

Figure 2:
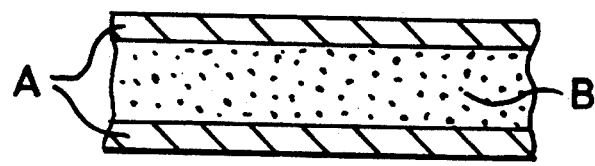

Examples of the use of the invention will now be given with reference to the accompanying diagrammatic drawings, in which:

FIG. 1 is a section through an entry board comprising a fibre board substrate and a cladding on one side only; and FIG. 2 is a section corresponding to FIG. 1 but through a backing board with cladding on both sides of the substrate.

In this embodiment of the present invention, a metal layer may be removed from a substrate after use, thus allowing the substrate to be disposed of and the metal reclaimed. Alternatively the substrate may be reused in some applications. Referring to FIG. 1, a weak bond between the metal A and the substrate B may be achieved by means of a low strength adhesive applied to one or both of the contacting surfaces or by an interposed double-sided adhesive tape or by treatment of the surfaces in a way which gives some degree of mechanical keying between them. It is not necessary that the bonding extends completely across the surfaces.

EXAMPLE 1

Aluminium sheet 0.25 millimeter thick was attached to a chipboard substrate 1.5 millimeters thick using a low strength permanent tack adhesive. The adhesive was applied to the chipboard using a spraying technique. The performance of the board was comparable to that of conventional boards in terms of rigidity, resistance to torque and the heat of the drill bit, and size of burrs, and the aluminium sheet was readily demountable.

EXAMPLE 2

The preferred process uses aluminium 40 microns (0.04 mm) thick bonded on to a paper board of approximately 500 microns (0.5 mm) thick. The adhesive layer is intended to be the mininum which will hold the layers together during storage, handling, cutting, transportation and positioning. The thickness of the adhesive layer is approximately 3 microns and an ideal peeling force between the aluminium and paper of about 50 N/m (Newtons/meter) is achieved. This corresponds to a tensile strength of the bond of about 40 kN/m$^2$ (kilo Newtons/square meter). Tests have shown that the peeling force must be below 500 N/m corresponding to a tensile strength of about 400 kN/m$^2$.

It will be appreciated that the substrate thickness could be greater than 0.5 mm and that the foil or sheet could be of a slightly different thickness.

EXAMPLE 3

In a trial of the drill lubricant, the composite board of Example 2 was sprayed on the paper side with fine solid ptfe particles dispersed in a carrier fluid. The carrier evaporated leaving a thin ptfe layer on the paper. The coating weight was about 0.6 g of ptfe over each square meter of surface. After drilling 1000 holes through a typical stack of 3 circuit boards with the treated entry board in position no resin build-up was observed on the drill. Another drill used under identical conditions but with no ptfe on the entry board showed considerable resin build-up.

It will be appreciated that the entry board of the present invention could equally well be used as a backing board.

I claim:

1. An entry board for use adjacent a printed circuit board (PCB) during drilling therethrough, comprising a PCB-engaging sheet adapted to resist burr-formation during drilling, characterized in that said sheet is laminated with a non-metallic sheet over whose exposed surface is distributed a drill lubricant selected from the group consisting of graphite, molybdenum disulphide and polytetrafluoroethane.

2. An entry board according to claim 1, in which the non-metallic sheet is a paper board in which the lubricant is interspersed at least in a surface layer thereof.

3. An entry board according to claim 1, in which the non-metallic sheet is a paper board on which the lubricant is applied as a dry film.

4. An entry board according to claim 1, wherein the abutting faces of said non-metallic sheet (B) and said PCB engaging sheet (A) are joined such that there is no relative slip during transportation, cutting and positioning, and such that they are separable by peeling them apart.

5. A method of manufacturing an entry board according to claim 2, comprising interspersing the lubricant in the paper fibre during manufacture of the paper board.

6. A method of manufacturing an entry board according to claim 3, comprising applying the lubricant as a dispersion in a carrier fluid on to the paper board and allowing the carrier fluid to evaporate.

7. A method of using an entry board according to claim 1 for drilling a printed circuit board, comprising the steps of placing said entry board next to the printed circuit board and drilling through both boards.

8. A composite entry or backing board for use adjacent a printed circuit board during drilling therethrough, in which the adjacent faces of two laminar components of the entry board are joined such that there is no relative slip during transportation, cutting and positioning, and they are separable by peeling them apart after use.

9. A board according to claim 8, in which the two laminar components are a substrate of fibrous board or paper, and a metal or metal alloy foil or sheet.

10. A board according to claim 8, in which the laminar components are joined by an intermediate layer of a low-strength adhesive.

11. A board according to claim 9, in which the adhesive material is coupled less strongly to the metal or metal alloy component than to the substrate.

12. A method of using an entry board according to claim 8 for drilling a printed circuit board, comprising the steps of placing said entry board next to the printed circuit board and drilling through both boards.

13. A method according to claim 12, including the further step of peeling off one of the laminar components of the entry board for reclamation.

14. An entry board, for use adjacent a printed circuit board (PCB) during drilling therethrough, comprising a PCB-engaging sheet adapted to resist burr-formation during drilling, wherein the sheet is laminated with a paper board having inner and outer surfaces, the inner surface of which is bonded to the PCB-engaging sheet, and the outer surface of which is coated with a film of dry lubricant.

15. An entry board according to claim 14, wherein abutting faces of said paper board and said PCB-engaging sheet are joined such that there is no relative slip during transportation, cutting and positioning, and such that they are separable by peeling them apart.

16. A method of using the entry board of claim 14, comprising the steps of placing said entry board next to a printed circuit board and drilling through both boards.

* * * * *